(12) United States Patent
Ballon et al.

(10) Patent No.: US 6,919,587 B2
(45) Date of Patent: Jul. 19, 2005

(54) LOW-CAPACITANCE BIDIRECTIONAL PROTECTION DEVICE

(75) Inventors: Christian Ballon, Tours (FR); Rachel Pezzani-Legall, Rochecorbon (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/325,626

(22) Filed: Dec. 19, 2002

(65) Prior Publication Data

US 2003/0116779 A1 Jun. 26, 2003

(30) Foreign Application Priority Data

Dec. 21, 2001 (FR) ............................................. 01 16755

(51) Int. Cl.$^7$ .............................................. H01L 29/74
(52) U.S. Cl. ...................................... 257/107; 257/111
(58) Field of Search ................. 257/107–119, 120–132, 257/150–163; 361/56, 111, 119, 118

(56) References Cited

U.S. PATENT DOCUMENTS

| 4,058,741 A | | 11/1977 | Tokunaga et al. |
| 4,080,538 A | * | 3/1978 | Kawakami et al. .......... 327/381 |
| 4,151,011 A | * | 4/1979 | Mihashi et al. .............. 438/139 |
| 4,202,024 A | * | 5/1980 | Simokat ..................... 361/91.6 |
| 4,901,130 A | * | 2/1990 | Jeudi et al. .................. 257/119 |
| 5,150,271 A | | 9/1992 | Unterweger et al. |
| 5,245,499 A | * | 9/1993 | Senes ........................... 361/56 |
| 5,274,524 A | * | 12/1993 | Pezzani et al. ................ 361/56 |
| 5,468,976 A | | 11/1995 | Evseev et al. |
| 5,986,289 A | * | 11/1999 | Simmonet .................... 257/109 |
| 6,173,242 B1 | * | 1/2001 | Davy .......................... 703/14 |
| 6,407,901 B1 | | 6/2002 | Casey et al. |
| 6,552,371 B2 | * | 4/2003 | Levine et al. ................ 257/110 |
| 2003/0116779 A1 | * | 6/2003 | Ballon et al. ................ 257/107 |

FOREIGN PATENT DOCUMENTS

| DE | 2839222 A | 3/1979 |
| WO | WO 0145174 A | 6/2001 |

OTHER PUBLICATIONS

French Search Report from French priority application No. 01/16755, filed Dec. 21, 2001.
S.M. Size, *Physics of Semiconductor Devices*, 1981, John Wiley & Sons, New York, p. 192, XP002209838.

* cited by examiner

*Primary Examiner*—Laura M Schillinger
(74) *Attorney, Agent, or Firm*—Lisa K. Jorgenson; William R. McClellan; Wolf, Greenfield & Sacks, P.C.

(57) ABSTRACT

A low-capacitance bidirectional device of protection against overvoltages, intended to be used at high frequencies, including first and second discrete one-way Shockley diodes, the cathode and the anode of the first diode being respectively connected to the anode and to the cathode of the second diode, the break-over voltages of each diode ranging between 50 and 125 V.

5 Claims, 3 Drawing Sheets

LOW-CAPACITANCE BIDIRECTIONAL PROTECTION DEVICE

BACKGROUND OF THE INVENTION

1. Field of the Invention

The present invention relates to a low-capacitance bidirectional device of protection against overvoltages. More specifically, the present invention relates to a bidirectional protection device intended for high-frequency applications.

2. Discussion of the Related Art

FIG. 1 shows a conventional structure of a bidirectional protection device 10. As usual in the representation of integrated circuits, the different regions are not drawn to scale.

Device 10 is formed of a monolithic circuit in which are formed two vertical Shockley diodes in antiparallel. The first vertical Shockley diode 11 is shown to the left of FIG. 1, and the second vertical Shockley diode 12 is shown to the right of FIG. 1.

The monolithic circuit includes a lightly-doped substrate 15 of conductivity type N. Substrate 15 includes a heavily-doped well 16 of conductivity type P on the side of its upper surface 17, and a heavily-doped well 18 of conductivity type P on the side of its lower surface 19.

First Shockley diode 11, located to the left of FIG. 1, includes an intermediary buried region 20, of conductivity type N, more heavily doped than substrate 15 but much more lightly doped than P-type well 16, arranged at the interface between P-type well 16 and substrate 15, and a heavily-doped N-type cathode region 21, arranged on the side of upper surface 17 of substrate 15 in P-type well 16. Cathode region 21 consists, for example, of spaced apart concentric rings, in parallel strips, or in islands separated according to a network.

Similarly, second Shockley diode 12, located to the right of FIG. 1, includes a buried region 22 of conductivity type N, and an N-type heavily-doped cathode region 23.

Upper and lower insulating regions 26 and 27 respectively cover the periphery of upper and lower surfaces 17 and 19 of substrate 15.

Upper and lower metallization layers 30 and 31 respectively cover the upper and lower surfaces 17 and 19 of substrate 15. Upper metallization layer 30 acts as the cathode electrode of first Shockley diode 11 by being connected to N-type cathode region 21, and of the anode electrode of second Shockley diode 12 by being connected to P-type well 16. Lower metallization layer 31 acts as the role of the anode electrode of first Shockley diode 11 by being connected to P-type well 18, and of the cathode electrode of second Shockley diode 12 by being connected to N-type cathode region 23. Upper and lower metallization layers 30 and 31, respectively, are connected to terminals A and B of device 10.

Conventionally, when the voltage applied across bidirectional protection device 10 is included between positive and negative break-over voltages, device 10 is non-conductive, and said to be in the off state. When the voltage is greater than the positive break-over voltage or smaller than the negative break-over voltage, the device is conductive. For the device to switch from the on state to the off state, the current flowing therethrough must fall below a threshold level.

For the two break-over voltages to have substantially the same absolute value, the dopant concentrations respectively of buried regions 20 and 22, and of P-type wells 16 and 18, must be identical.

In the off state, device 10 of FIG. 1 exhibits a general capacitance that may be high, which is a disadvantage upon use of protection device 10 for high-frequency applications, for example, applications in telecommunications.

A possibility, to decrease the general capacitance of device 10 in the off state, is to replace a device 10 having the desired break-over voltage by two identical sub-devices 10 assembled in series, each having a break-over voltage equal to half the desired total break-over voltage. The capacitances of the elementary sub-devices being assembled in series, the total capacitance is equal to the capacitance of one sub-device divided by two. However, when the break-over voltage of the bidirectional device of FIG. 1, which can be obtained, for example, by increasing the dopant concentration of buried regions 20, 22 (the dopant concentrations of wells 16, 18 remaining constant) is divided by two, its capacitance appears to increase. Thus, the decrease in capacitance obtained by the series assembly is less than expected.

SUMMARY OF THE INVENTION

The present invention aims at obtaining a bidirectional protection device having a low capacitance.

To achieve this and other objects, the present invention provides a low-capacitance bidirectional device of protection against overvoltages, for use at high frequencies, including first and second discrete one-way Shockley diodes, the cathode and the anode of the first diode being respectively connected to the anode and to the cathode of the second diode, the break-over voltages of each diode ranging between 50 and 125 V.

According to an embodiment of the present invention, each monolithic circuit includes a lightly-doped substrate of a first conductivity type, a first heavily-doped well of a second conductivity type including a first heavily-doped region of the first conductivity type, a second intermediary region of the first conductivity type located between the substrate and the first well, more heavily doped than the substrate and less heavily doped than the first well, and a second heavily-doped well of the second conductivity type, the capacitance, when the diode is non conductive, associated with the junction between the first well and the second region, being greater than the capacitance associated with the junction between the substrate and the second well.

According to an embodiment of the present invention, the dopant concentration of the second P-type well is smaller than the dopant concentration of the first P-type well.

According to an embodiment of the present invention, the dopant concentration of the substrate is approximately $5*10^{15}$ atoms/cm$^3$ and, in the vicinity of the junction between the first well and the second region, the dopant concentration of the second region is greater than $1*10^{16}$ atoms/cm$^3$ and the dopant concentration of the first well is $4*10^{18}$ atoms/cm$^3$.

The present invention also provides a method for manufacturing a bidirectional device of protection against overvoltages, for high-frequency applications, including the steps of forming two Shockley diodes on two distinct monolithic circuits, each diode having a break-over voltage ranging between 50 and 125 V; and connecting the cathode and the anode of the first diode respectively to the anode and to the cathode of the second diode.

The foregoing objects, features and advantages of the present invention, will be discussed in detail in the following non-limiting description of specific embodiments in connection with the accompanying drawings.

DETAILED DESCRIPTION

Figure 1:
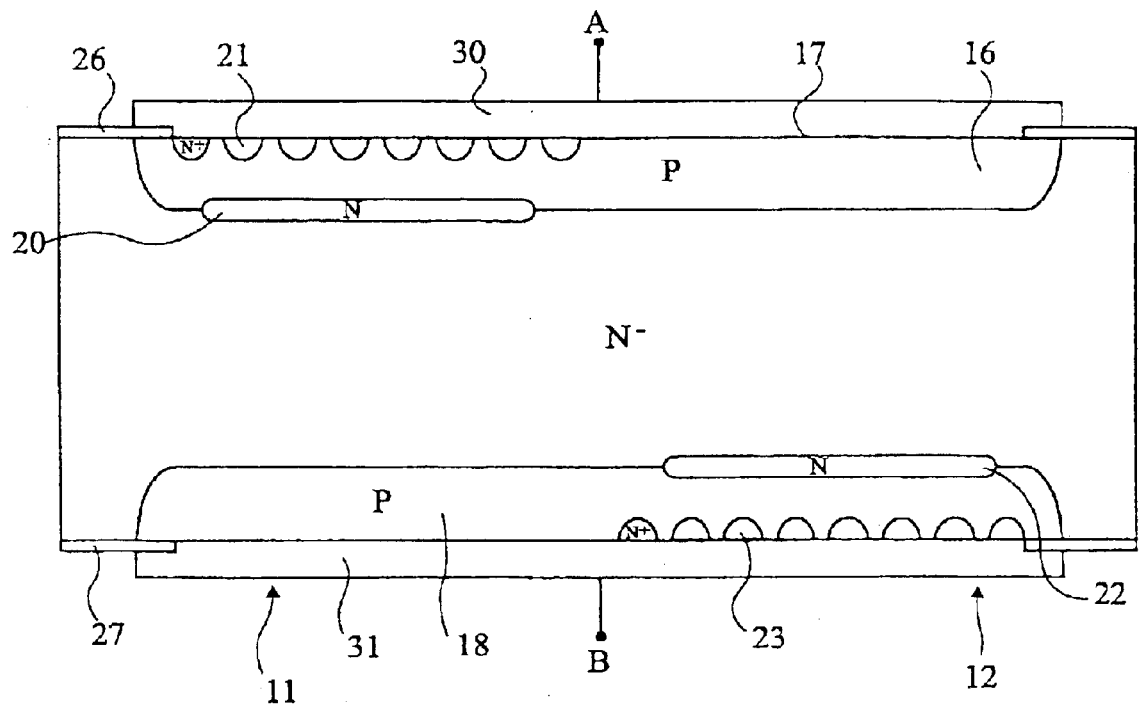
FIG. 1, previously described, schematically shows a monolithic circuit integrating a conventional bidirectional protection device.

The present invention is the result of a study on the distribution of the capacitances in the internal structure of device 10 of FIG. 1, which contribute to the total capacitance, $C_t$, of device 10.

In the off state, on the side of first Shockley diode 11, the junction between P-type well 16 and buried N-type region 20 exhibits a first capacitance, $C_1$, while the junction between substrate 15 and P-type well 18 exhibits a second capacitance, $C_2$. Similarly, on the side of second Shockley diode 12, the junction between P-type well 16 and substrate 15 exhibits capacitance $C_2$ while the junction between P-type well 18 and buried region 22 exhibits capacitance $C_1$. For the two Shockley diodes, portions of P-type wells 16, 18 which contact metal layers 30, 31 at the level of associated N-type cathode regions 21, 23 conventionally act as emitter short-circuits so that no capacitance is associated with the junction between N-type cathode regions 21, 23 and P-type wells 16, 18.

Figure 2:
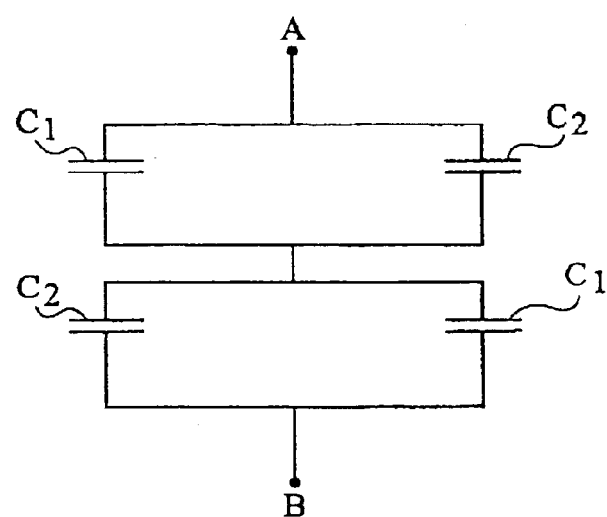
FIG. 2 shows an equivalent capacitance circuit of the device of FIG. 1.

FIG. 2 shows an equivalent electric diagram of device 10 of FIG. 1 only considering capacitances. The equivalent circuit is formed by the two capacitances in parallel $C_1$ and $C_2$, corresponding to the junctions located on the side of upper surface 17, assembled in series with the two capacitances in parallel $C_2$ and $C_1$, corresponding to the junctions located on the side of lower surface 19. The equivalent total capacitance $C_t$ of device 10 is then provided by the following relation:

$$C_t = (C_1 + C_2)/2$$

Qualitatively, if capacitance $C_1$ is much greater than capacitance $C_2$, $C_t$ is close to $C_1/2$.

Figure 3:
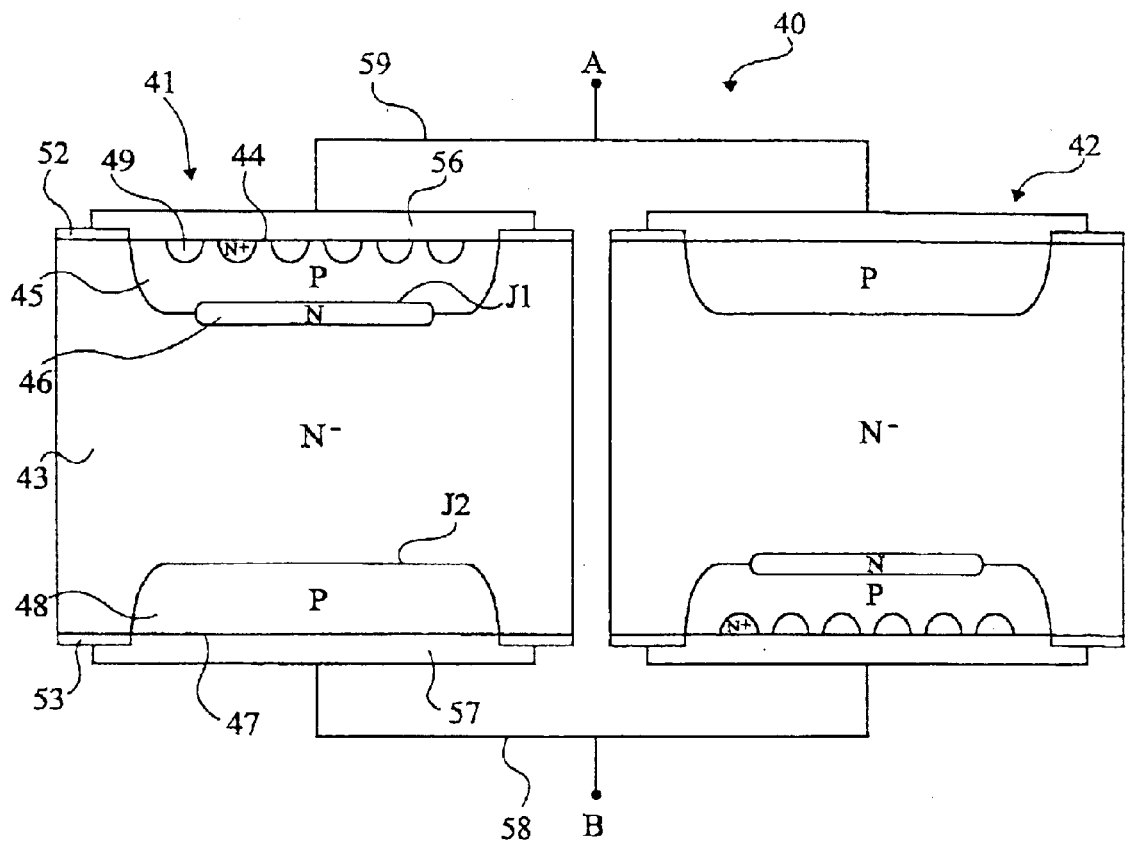
FIG. 3 schematically shows the bidirectional protection device according to the present invention.

As shown in FIG. 3, the present invention provides using as a protection device 40 an antiparallel assembly of first and second one-way vertical discrete Shockley diodes 41 and 42. Diodes 41, 42 have an identical structure, second diode 42, located to the right of FIG. 3, being shown upside down with respect to first diode 41, located to the left of FIG. 3. In the following description, only first diode 41 will be described in detail.

First diode 41 includes a lightly-doped N-type substrate 43. Substrate 43 includes, on its upper surface side 44, a heavily-doped P-type well 45. A buried N-type region 46 is arranged at the interface between substrate 43 and P-type well 45. Buried region 46 has a dopant concentration greater than the dopant concentration of substrate 43 and smaller than that of P-type well 45. Substrate 43 includes, on its lower surface side 47, a heavily-doped P-type anode well 48. On the side of upper surface 44 is formed an N-type cathode region 49, in P-type well 45, for example, in the form of separate concentric rings, of spaced apart parallel strips, or of an island network.

Upper and lower insulating layers 52 and 53, respectively, cover the peripheries of upper and lower surfaces 54 and 57, respectively, of substrate 43.

An upper cathode metal layer 56 contacts, one the side of upper surface 44, P-type well 45 and N-type cathode region 49. A lower anode metal layer 57 contacts, on the side of lower surface 47, P-type anode well 48.

As previously indicated, second diode 42 has a structure similar to that of first monolithic circuit 41, but is shown upside down in FIG. 3.

The anode of the first Shockley diode is connected by an electric connection 58 to the cathode of the second Shockley diode. The cathode of the first Shockley diode is connected by an electric connection 59 to the anode of the second Shockley diode. The terminals of device 40 are designated with references A and B. The Shockley diodes are thus interconnected in the same way as the device 10 of FIG. 1. The general operation of device 40 according to the present invention is similar to that of device 10 of FIG. 1.

However, as will be detailed hereafter, the total equivalent capacitance, $C_T$, of device 40 according to the present invention, when the Shockley diodes are off, is different from that of device 10 of FIG. 1.

Figure 4:
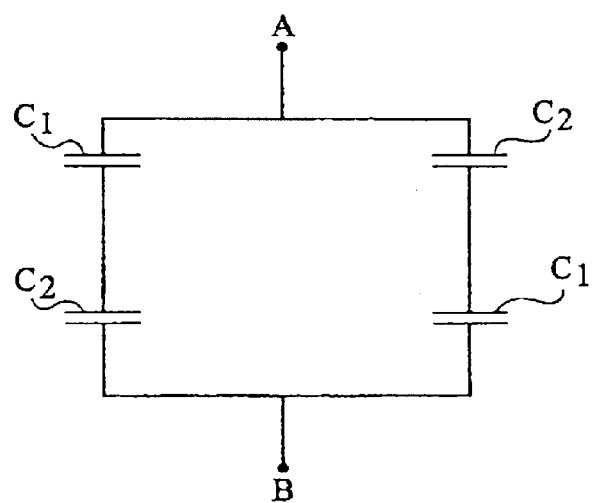
FIG. 4 shows an equivalent capacitance circuit of the device of FIG. 3.

FIG. 4 shows an equivalent electric diagram of device 40 according to the present invention only considering capacitances. Each monolithic circuit 41, 42 includes, in series, a first capacitance, corresponding to the capacitance of junction J1 between N-type buried region 46 and P-type well 45, and a second capacitance corresponding to the capacitance of junction J2 between P-type well 48 and substrate 43. Portions of P-type well 45 contacting the upper cathode metal layer 56, at the level of cathode region 49, act, in a known manner, as emitter short-circuits so that no capacitance is associated with the junction between cathode region 49 and P-type well 45 for the two diodes 41, 42. When the dopant concentrations of the various regions of diodes 41, 42 are the same as those of device 10 of FIG. 1, the corresponding capacitances are substantially equal. To simplify the comparison, these capacitances are called $C_1$, $C_2$ in FIG. 4 as in FIG. 2.

The total equivalent capacitance $C_T$ of device 40 according to the present invention corresponds to the arranging in parallel of the two series capacitances $C_1$ and $C_2$ of monolithic circuit 41 with the two series capacitances $C_1$ and $C_2$ of monolithic circuit 42. The total equivalent capacitance $C_T$ is thus provided by the following formula:

$$C_T = 2^*(C_1{}^*C_2)/(C_1+C_2)$$

Qualitatively, if capacitance $C_1$ has a much greater value than capacitance $C_2$, $C_T$ is close to $2^*C_2$ and is much smaller than above-mentioned capacitance $C_1$, which was close to $C_1/2$.

Figure 5:
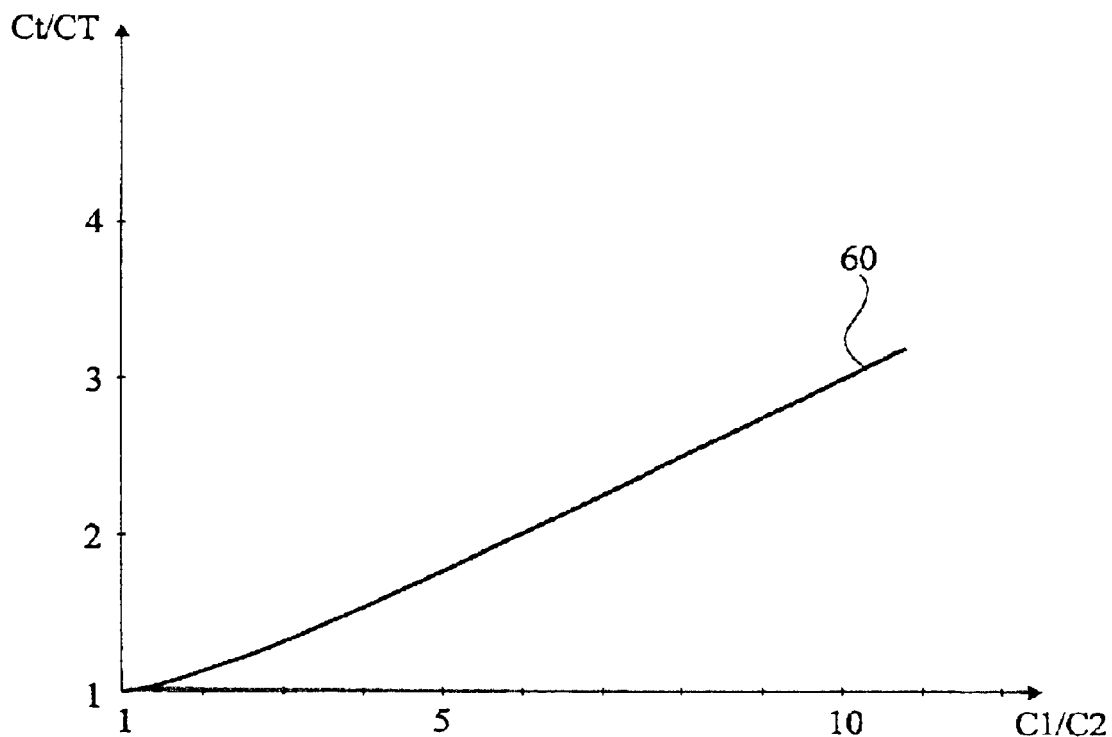
FIG. 5 illustrates a curve representative of the ratio of the total capacitances of the device according to the present invention and of the device of FIG. 1 as a function of the junction capacitance ratio of the device according to the present invention.

FIG. 5 illustrates a curve 60 representative of the ratio of total capacitances $C_t$ and $C_T$ according to the ratio of capacitances $C_1$ and $C_2$. Capacitance $C_1$ being always greater than capacitance $C_2$, curve 60 is drawn for values of $C_1/C_2$ greater than 1.

The higher capacitance ratio $C_1/C_2$, the higher capacitance ratio $C_t/C_T$. This means that the smaller capacitance $C_2$ is with respect to capacitance $C_1$, the smaller the total equivalent capacitance $C_T$ of device 40 according to the present invention is with respect to total equivalent capacitance $C_t$ of device 10 of FIG. 1.

Device 40 according to the present invention exhibits, by the sole fact that the Shockley diodes are formed in a discrete manner, a total capacitance $C_T$ smaller than that of device 10 of FIG. 1 in which the two Shockley diodes are integrated on a single monolithic circuit. Thus, although the current tendency is to integrate several components in a same monolithic circuit as soon as this is technically possible, the present invention shows that, to solve the problem posed, it is particularly advantageous to have a structure where each component is formed discretely.

Figure 6:
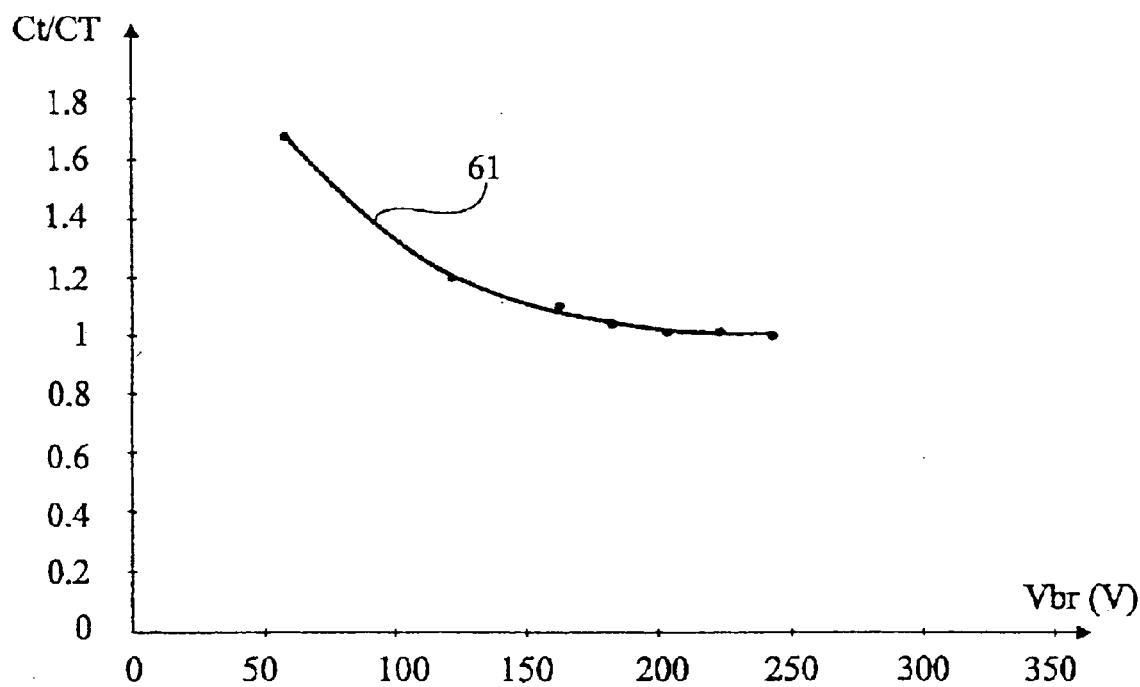
FIG. 6 illustrates a curve representative of the ratio of the total capacitances of the device according to the present invention and of the device of FIG. 1 according to the break-over voltage of the device according to the present invention.

FIG. 6 illustrates a curve 61 representative of the ratio between total capacitances $C_t/C_T$ according to the break-over voltage of the Shockley diodes (assumed to be identical for the two diodes).

For each Shockley diode, the break-over voltage is essentially determined by the difference of dopant concentration on either side of junction J1. Curve 61 is drawn assuming that, for each Shockley diode of device 40, the concentrations of P-type wells 45 and 48 are fixed and identical and that the concentration of N-type buried region 46 varies according to the desired break-over voltage. It is also assumed that, for device 10 of FIG. 1, the concentrations of P-type wells 16 and 18 are fixed and identical and that the concentrations of buried regions 20 and 22 are identical and selected according to the desired break-over voltage. Capacitances $C_1$ and $C_2$ are determined by the dopant concentrations of the regions forming the junctions with which they are associated. Thus, curve 61 is plotted for a constant capacitance $C_2$ and variable capacitance $C_1$.

Curve 61 illustrates the fact that the ratio between total capacitances $C_t/C_T$ is at its highest for break-over voltages close to 50 V, and decreases as the break-over voltage increases (which corresponds to a decrease in capacitance $C_1$). Device 40 according to the present invention thus exhibits a total capacitance $C_T$ which decreases as compared to total capacitance $C_1$ of device 10 of FIG. 1 as the break-over voltage decreases. For a break-over voltage of 125 V, total capacitance $C_T$ is already smaller by more than 20% than $C_t$. For a break-over voltage of 58 V, total capacitance $C_T$ is smaller by more than 40% than $C_1$. The present invention thus finds a particularly advantageous application for break-over voltages ranging between 50 V and 125 V.

As an example, a capacitance ratio $C_t/C_T$ of approximately 1.7 is obtained for a break-over voltage of 58 V corresponding to a dopant concentration of substrate 15, 43 of $5*10^{15}$ atoms/cm$^3$, a dopant concentration of N-type buried layers 20, 22, 46 resulting from a surface concentration ranging between $2*10^{17}$ and $6*10^{17}$ atoms/cm$^3$, and dopant concentrations of P-type well 16, 18, 45, 48 resulting from a surface concentration ranging between $2*10^{18}$ and $8*10^{18}$ atoms/cm$^3$.

For a determined break-over voltage, it is possible to further decrease ratio $C_t/C_T$ by decreasing capacitance $C_2$ of the junction between substrate 43 and P-type well 48. Indeed, given the expressions of total capacitances $C_T$ and $C_t$, a decrease in capacitance $C_2$ causes a significant decrease in total capacitance $C_T$ while it has less effect upon total capacitance $C_t$.

To decrease capacitance $C_2$, it is desired to obtain an avalanche voltage of the junction between substrate 43 and P-type well 48. For this purpose, it is possible to decrease the dopant concentration of P-type well 48 in the vicinity of junction J2. This may be obtained by forming a deeper P-type well 48. As an example, for a dopant surface concentration of approximately $4*10^{18}$ atoms/cm$^3$, and a depth of well 48 of 20 μm, a ratio $C_t/C_T$ of 1.7 is obtained, for a dopant surface concentration of approximately $1*10^{18}$ atoms/cm$^3$, and a depth of well 48 of 110 μm, a ratio $C_t/C_T$ of 2.12 is obtained, and for a dopant surface concentration of approximately $3*10^{16}$ atoms/cm$^3$, and a depth of well 48 of 30 μm, a ratio $C_t/C_T$ of 1.95 is obtained.

The fact that Shockley diodes 41, 42 of device 40 according to the present invention are formed on distinct monolithic circuits 41, 42, enables setting different dopant concentrations for P-type wells 45 and 48, and thus decreasing $C_2$. When the bidirectional device is formed on a single monolithic circuit, it is not possible in practice to locally modify the dopant concentrations of P-type wells 16 and 18 to reduce capacitance $C_2$, which, further, as already mentioned, results in a small decrease only in total capacitance $C_t$.

Of course, the present invention is likely to have various alterations, modifications, and improvements which will readily occur to those skilled in the art. In particular, the monolithic circuits may include guard rings on the upper and lower surface sides surrounding the P-type wells to avoid short-circuiting the substrate and the P-type wells upon deposition of the metal layers. Further, the device according to the present invention has been described with break-over voltages of the same absolute value. Clearly, by forming Shockley diodes 41, 42 in a discrete manner, it is possible to easily set different dopant concentrations for P-type wells 45, and thus obtain a bidirectional device 40 having positive and negative break-over voltages of different values.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

What is claimed is:

1. A low-capacitance bidirectional device of protection against overvoltages, for use at high frequencies, including first and second discrete one-way Shockley diodes, a cathode of the first diode being connected to an anode of the second diode, and an anode of the first diode being connected to a cathode of the second diode, the break-over voltages of each diode ranging between 50 and 125 V.

2. The device of claim 1, wherein each monolithic circuit includes a lightly-doped substrate of a first conductivity type, a first heavily-doped well of a second conductivity type including a first heavily-doped region of the first conductivity type, a second intermediary region of the first conductivity type located between the substrate and the first well, more heavily doped than the substrate and less heavily doped than the first well, and a second heavily-doped well of the second conductivity type, the capacitance, when the diode is non conductive, associated with the junction between the first well and the second region, being greater than the capacitance associated with the junction between the substrate and the second well.

3. The device of claim 2, wherein the second well is of P-type and has a concentration smaller than the dopant concentration of the first well.

4. The device of claim 2, wherein the dopant concentration of the substrate is approximately $5*10^{15}$ atoms/cm$^3$ and wherein, in the vicinity of the junction between the first well and the second region, the dopant concentration of the second region is greater than $1*10^{16}$ atoms/cm$^3$ and the dopant concentration of the first well is $4*10^{18}$ atoms/cm$^3$.

5. An electric circuit including the protection device of claim 1.

* * * * *

UNITED STATES PATENT AND TRADEMARK OFFICE
CERTIFICATE OF CORRECTION

PATENT NO. : 6,919,587 B2  
DATED : July 19, 2005  
INVENTOR(S) : Christian Ballon and Rachel Pezzani-Le Gall It is certified that error appears in the above-identified patent and that said Letters Patent is hereby corrected as shown below:

Column 4,
Line 16, should read -- An upper cathode metal layer 56 contacts, on the side of --.

Signed and Sealed this

Thirteenth Day of September, 2005

JON W. DUDAS
*Director of the United States Patent and Trademark Office*